US010256307B2

(12) United States Patent
Chien et al.

(10) Patent No.: US 10,256,307 B2
(45) Date of Patent: Apr. 9, 2019

(54) SEMICONDUCTOR DEVICE

(71) Applicant: MACRONIX International Co., Ltd., Hsinchu (TW)

(72) Inventors: Yu-Chin Chien, Hsinchu (TW); Ching-Lin Chan, Hsinchu (TW); Cheng-Chi Lin, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/589,466

(22) Filed: May 8, 2017

(65) Prior Publication Data

US 2018/0323266 A1 Nov. 8, 2018

(51) Int. Cl.
*H01L 29/40* (2006.01)
*H01L 29/735* (2006.01)
*H01L 29/08* (2006.01)
*H01L 29/10* (2006.01)
*H01L 29/06* (2006.01)

(52) U.S. Cl.
CPC ........ *H01L 29/404* (2013.01); *H01L 29/0692* (2013.01); *H01L 29/0808* (2013.01); *H01L 29/0821* (2013.01); *H01L 29/1008* (2013.01); *H01L 29/735* (2013.01)

(58) Field of Classification Search
CPC .................................................... H01L 29/404
See application file for complete search history.

(56) References Cited

U.S. PATENT DOCUMENTS

| | | | |
|---|---|---|---|
| 6,365,924 B1* | 4/2002 | Wang | H01L 27/0262 257/110 |
| 2009/0179222 A1* | 7/2009 | Ker | H01L 27/0262 257/119 |
| 2010/0021357 A1 | 1/2010 | Kalnes et al. | |
| 2010/0128401 A1 | 5/2010 | Lai et al. | |
| 2010/0171149 A1 | 7/2010 | Denison et al. | |
| 2011/0051298 A1 | 3/2011 | Lai | |
| 2011/0310516 A1* | 12/2011 | Christensen | H01L 27/0255 361/56 |
| 2012/0241900 A1 | 9/2012 | Chen et al. | |
| 2013/0170080 A1 | 7/2013 | Chen | |

(Continued)

FOREIGN PATENT DOCUMENTS

| | | |
|---|---|---|
| CN | 105793986 | 7/2016 |
| TW | 364161 | 7/1999 |

(Continued)

OTHER PUBLICATIONS

"Office Action of Taiwan Counterpart Application," dated Oct. 6, 2017, p. 1-p. 10, in which the listed references were cited.

*Primary Examiner* — Mounir S Amer
(74) *Attorney, Agent, or Firm* — J.C. Patents

(57) ABSTRACT

A semiconductor device is provided. The semiconductor device includes a first doped region and a second doped region of a first conductive type and a third doped region of a second conductive type located in a substrate. The second doped region is located at a side of the first doped region. A top-view pattern of the second doped region has at least one recess portion. The third doped region is located between the first doped region and the second doped region. A top-view pattern of the third doped region has at least one protruded portion corresponding to the at least one recess portion.

16 Claims, 13 Drawing Sheets

(56) References Cited

U.S. PATENT DOCUMENTS

| | | | |
|---|---|---|---|
| 2013/0181211 A1 | 7/2013 | Chen et al. | |
| 2013/0221404 A1* | 8/2013 | Chan .................... | H01L 29/861 257/140 |
| 2016/0329094 A1 | 11/2016 | Luan et al. | |

FOREIGN PATENT DOCUMENTS

| | | |
|---|---|---|
| TW | 201108413 | 3/2011 |
| TW | 201201369 | 1/2012 |

* cited by examiner

SEMICONDUCTOR DEVICE

BACKGROUND OF THE INVENTION

1. Field of the Invention

The present invention generally relates to a semiconductor device, in particular, to a bipolar junction transistor (BJT).

2. Description of Related Art

A transistor is a solid state semiconductor device, which has advantages such as small in size, highly efficient, long lifetime, fast operating speed and so forth. A bipolar junction transistor (BJT) is a transistor consists of two PN junctions. The BJT is capable of amplifying signals, effectively controlling power, being operated at high speed. Besides, the BJT has great durability. Therefore, the BJT is comprehensively applied to control current, such as being a switching device controlling a DC power load and an analog signal amplifier. In addition, the BJT is also applied in 3D bipolar simulation, an NPN device, AC frequency response and so forth.

In a case of common emitter, a ratio of a collector current to a base current is referred as a common emitter current gain, which is an important parameter of the BJT that is served as a signal amplifier. In general, when a breakdown voltage between the collector and the base is fixed, the common emitter current gain is inversely proportional to the breakdown voltage between the collector and the emitter. Thereby, it is difficult to simultaneously increase the common-emitter current gain and the collapse voltage between the collector and the emitter.

SUMMARY OF THE INVENTION

The present invention provides a semiconductor device, which has a higher common emitter current gain and a higher breakdown voltage between a collector and an emitter at the same time.

A semiconductor device of an embodiment of the present invention includes a first doped region, a second doped region and a third doped region. The first doped region and the second doped region are of a first conductive type, and the third doped region is of a second conductive type. The first doped region, the second doped region and the third doped region are located in the substrate. The second doped region is located at a side of the first doped region. A top-view pattern of the second doped region has at least one recess portion. The third doped region is located between the first doped region and the second doped region. A top-view pattern of the third doped region has at least one protruded portion in correspondence with the at least one recess portion.

In an embodiment of the present invention, the above-mentioned semiconductor device may further include a well region of the second conductive type, which is located in the substrate. A top-view pattern of the well region is located at an inner side of a top-view pattern of the first doped region. The second doped region and the third doped region are located in the well region.

In an embodiment of the present invention, the above-mentioned semiconductor device may further include a field region. The field region is located in the substrate, and the second doped region and the third doped region are located in the field region.

In an embodiment of the present invention, the top-view patterns of the above-mentioned first doped region and the third doped region may be closed ring patterns.

In an embodiment of the present invention, both of the top-view patterns of the above-mentioned second doped region and the third doped region may be in symmetrical shapes.

In an embodiment of the present invention, the above-mentioned at least one recess portion may include a plurality of recess portions, and the at least one protruded portion may include a plurality of protruded portions. The recess portions and the protruded portions are disposed in correspondence with each other.

In an embodiment of the present invention, a ratio of a depth of the above-mentioned at least one recess portion to a length of the top-view pattern of the second doped region along a first direction or a second direction may be ranged from 0.1 to 0.45. The first direction is intersected with the second direction.

In an embodiment of the present invention, a ratio of an inner circumference of the top-view pattern of the above-mentioned third doped region to an outer circumference of the top-view pattern of the third doped region may be ranged from 1 to 2. The inner circumference is a circumference of a boundary of the third doped region adjacent to the second doped region, the outer circumference is a circumference of a boundary of the third doped region adjacent to the first doped region.

In an embodiment of the present invention, the above-mentioned semiconductor device may further include a first stack and a second stack. The first stack is located on the substrate, and located between the first doped region and the third doped region. The first stack may include a first insulating layer and a first conductive structure sequentially stacked on the substrate. The second stack is located on the substrate, and located between the second doped region and the third doped region. The second stack may include a second insulating layer and a second conductive structure sequentially stacked on the substrate.

In an embodiment of the present invention, the above-mentioned first conductive structure may include a first polysilicon layer and a first metal silicide layer sequentially stacked on the first insulating layer. The second conductive structure may include a second polysilicon layer and a second metal silicide layer sequentially stacked on the second insulating layer. The semiconductor device may further include a first spacer and a second spacer. The first spacer is located at sidewalls of the first stack, and the second spacer is located at sidewalls of the second stack.

In an embodiment of the present invention, a ratio of a width of the above-mentioned first stack to a width of the second stack may be ranged from 0.5 to 1.5.

In an embodiment of the present invention, the above-mentioned second conductive structure may be electrically connected with the second doped region, and the first conductive structure may be electrically connected with the third doped region.

In an embodiment of the present invention, the above-mentioned first conductive structure may be electrically connected with the first doped region, and the second conductive structure may be electrically connected with the third doped region.

A semiconductor device of an embodiment of the present invention includes a first doped region, a second doped region, a third doped region, a first stack and a second stack. The first doped region and the second doped region are of a first conductive type, and the third doped region is of a second conductive type. The first doped region, the second doped region and the third doped region are located in the substrate. The second doped region is located at a side of the first doped region. The third doped region is located between the first doped region and the second doped region. The first stack and the second stack are located on the substrate. The first stack is located between the first doped region and the third doped region. The first stack includes a first insulating layer and a first conductive structure sequentially stacked on the substrate. The second stack is located between the second doped region and the third doped region. The second stack includes a second insulating layer and a second conductive structure sequentially stacked on the substrate.

A semiconductor device of an embodiment of the present invention includes a collector, an emitter and a base located in the substrate. A top-view pattern of the emitter is located at an inner side of a top-view pattern of the collector, and the top-view pattern of the emitter has a plurality of recess portions. The base is located between the collector and the emitter, and a top-view pattern of the base has a plurality of protruded portions in correspondence with the recess portions.

As above, the top-view pattern of the second doped region has at least one recess portion, so that a side of the second doped region that is facing the third doped region can have a larger surface area. Accordingly, more carriers can pass to the second doped region from the third doped region, or pass to the third doped region from the second doped region when the semiconductor is under operation. When the semiconductor device is served as a BJT, a common emitter current gain of the BJT can be accordingly increased.

Moreover, in some embodiments, the first stack may be disposed on the substrate between the first doped region and the third doped region, and the second stack may be disposed on the substrate between the second doped region and the third doped region. By applying voltage to the first stack, a width of a space charge region in the first doped region and the third doped region can be altered. Therefore, an electric field between the first doped region and the third doped region can be adjusted. Similarly, an electric field between the second doped region and the third doped region can be adjusted by applying voltage to the second stack. Therefore, a breakdown voltage between the first doped region and the second doped region can be increased by altering width of the space charge region in the first doped region, the second doped region and the third doped region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
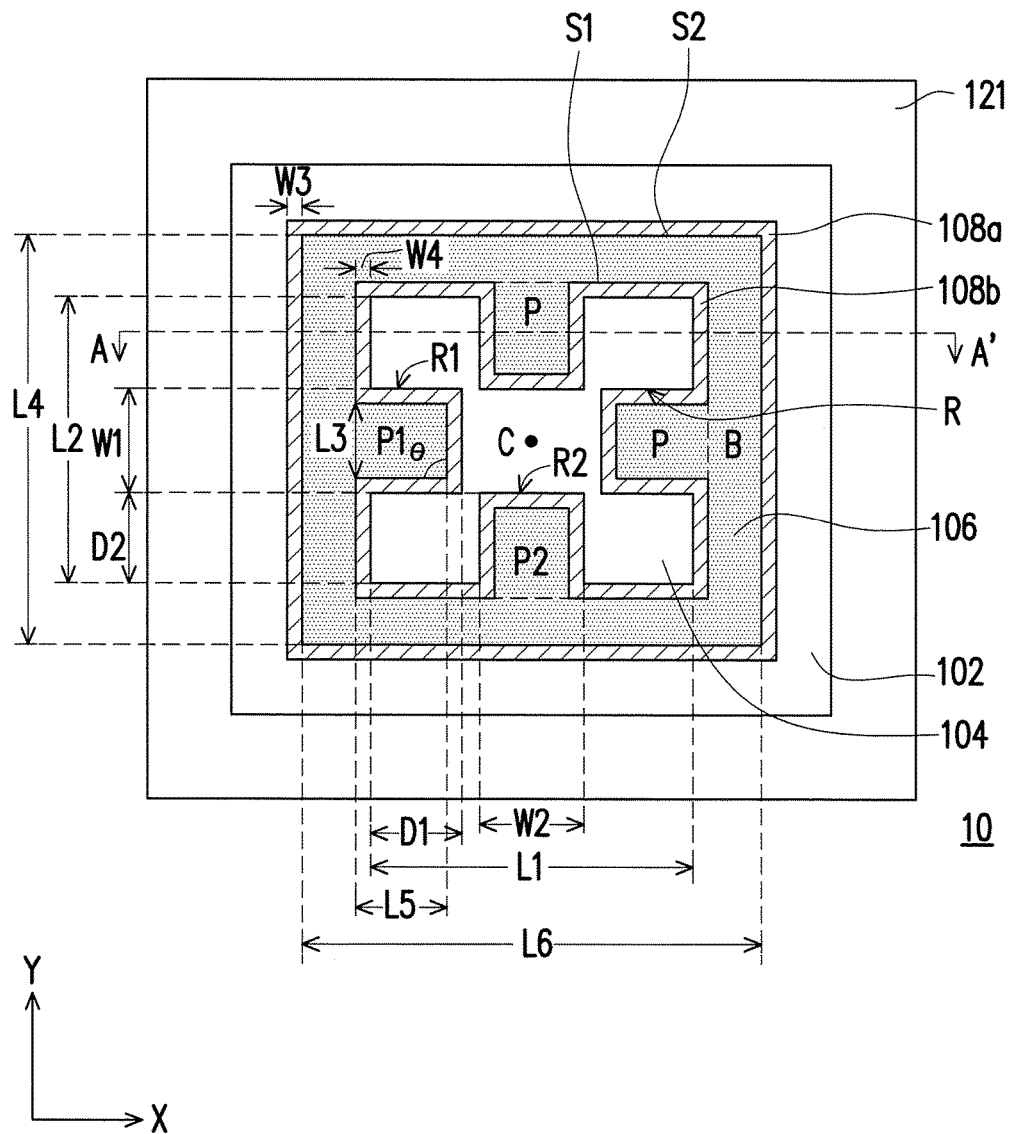
FIG. 1A is a schematic top view of a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
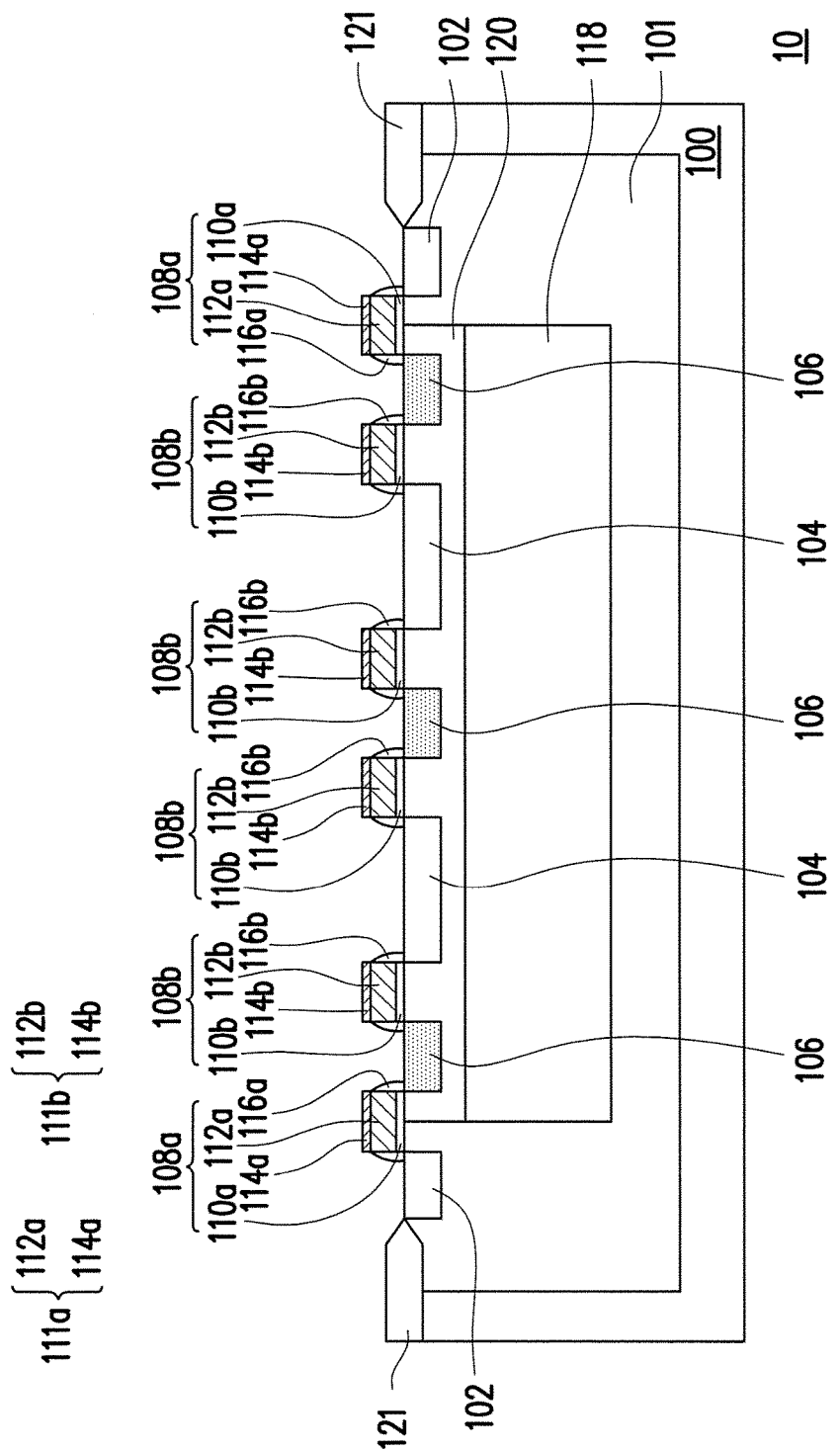
FIG. 1B is an enlarged schematic cross-sectional view along an A-A' line in FIG. 1A.

FIG. 1A is a schematic top view of a semiconductor device according to an embodiment of the present invention. FIG. 1B is an enlarged schematic cross-sectional view along an A-A' line in FIG. 1A.

Referring to FIG. 1A and FIG. 1B, a semiconductor device 10 of the present embodiment includes a substrate 100. The substrate 100 may be a semiconductor substrate. A material of the semiconductor substrate may include silicon, germanium, gallium arsenide, silicon carbide, indium arsenide, indium phosphorous or so forth. In some embodiments, the substrate 100 may be a silicon substrate, and the substrate 100 may be doped to be of a second conductive type. In the present embodiment, a first conductive type is N-type, and the second conductive type is P-type. In other embodiments, the first conductive type may be P-type, and the second conductive type may be N-type in this case. For instance, an N-type dopant is phosphorous or arsenide; a P-type dopant is boron.

The semiconductor device 10 of the present embodiment further includes a first doped region 102, a second doped region 104 and a third doped region 106 located in the substrate 100. The first doped region 102 and the second doped region 104 are of the first conductive type, while the third doped region 106 is of the second conductive type. In some embodiments, the substrate 100 has a deep well region 101 of the first conductive type therein, such that the first doped region 102, the second doped region 104 and the third doped region 106 are located in the deep well region 101. Referring to FIG. 1A, the third doped region 106 is located between the first doped region 102 and the second doped region 104. In other words, the first doped region 102 and the second doped region 104 are located at two opposing sides of the third doped region 106. In the present embodiment, the semiconductor 10 may be served as a BJT. In particular, the first doped region 102 may be served as a collector; the second doped region 104 may be served as an emitter; and the third doped region 106 may be served as a base. In some embodiments, doping concentrations of the first doped region 102, the second doped region 104 and the third doped region 106 may be respectively ranged from $10^{14}/cm^3$ to $10^{16}/cm^3$. Referring to FIG. 1A, in some embodiments, from a top-view, the third doped region 106 is within the first doped region 102; the second doped region 104 is within the third doped region 106. In other words, from a top-view, the second doped region 104, the third doped region 106 and the first doped region 102 are located outwardly from a center of the semiconductor device 10. In some exemplary embodiments, from a top-view, all patterns of the first doped region 102, the second doped region 104 and the third doped region 106 may be (but not limited to) symmetrical shapes.

In some exemplary embodiments of the present invention, from a top-view, the pattern of the first doped region 102 may be a closed ring pattern, which surrounds the third doped region 106, while the third doped region 106 surrounds the second doped region 104. For instance, the pattern of the first doped region 102 is a rectangular ring or a circular ring.

In some embodiments of the present invention, from a top-view, the third doped region 106 is a closed shape as well. In some exemplary embodiments, from a top-view, the third doped region 106 includes a body portion B and protruded portions P. The body portion B may be a ring pattern. For example, the pattern of the body portion B is a rectangular ring or a circular ring. The body portion B and the first doped region 102 may be concentric patterns. The protruded portion P is connected with the body portion B, and extended inwardly toward the interior of the semiconductor 10 (such as the center C of the semiconductor device 10). The third doped region 106 may have one or more protruded portions P. In some exemplary embodiments, the pattern of the body portion B is, for instance, a closed square ring. The third doped region 106 may have 4 protruded portions P, respectively disposed at 4 sides of the third doped region 106. Two of the 4 protruded portions P may be disposed to be corresponded with the other two of the 4 protruded portions P, such that the third doped region 106 forms a symmetrical structure. In one exemplary embodiment, two portions P1 of the 4 protruded portions P may be disposed on a first direction X; the other two portions P2 of the 4 protruded portions P may be disposed on a second direction Y. In some embodiments, the first direction X may be perpendicular to the second direction Y. Shapes and area of the 4 protruded portions P may be the same or different. In some embodiments, a shape of each protruded portion P may be square or circle. A vertex angle θ of each protruded portion P may be an angle of about 90° or a circular angle.

In some embodiments of the present invention, from a top-view, the second doped region 104 is within the third doped region 106. In other words, the second doped region 104 is within an area surrounded by the body portion B. The top-view pattern of the second doped region 104 has recess portions R in correspondence with the protruded portions P. In some exemplary embodiments of the present invention, two portions R1 of the 4 recess portions R may be disposed on a first direction X; the other two portions R2 of the 4 recess portions R may be disposed on a second direction Y. In some embodiments, if the recess portions R are omitted, an overall contour of the second doped region 104 is approximately appeared as a rectangle or a square. If the recess portion R are not omitted, the overall contour of the second doped region 104 is approximately appeared as an X-like shape.

In some embodiments, from a top-view, a ratio of a depth D1 of the recess portions R1 to a length L1 of the second doped region 104 along the first direction X (depth D1/length L1) may be ranged from 0.1 to 0.45. Similarly, a ratio of the depth D2 of the recess portions R2 to a length L2 of the second doped region 104 along the second direction Y (depth D2/length L2) may be ranged from 0.1 to 0.45 as well. In addition, a ratio of a width W1 of the recess portions R1 to the length L2 of the second doped region 104 along the second direction Y (width W1/length L2) may be ranged from 0.1 to 0.8. Similarly, a ratio of the width W2 of the recess portions R2 to the length L1 of the second doped region 104 along the first direction X (width W2/length L1) may be ranged from 0.1 to 0.8. In an embodiment, along the first direction X, a ratio of a length L5 of the protruded portions P2 to a length L6 of the third doped region 106 (length L5/length L6) may be ranged from 0.1 to 0.45. Along the second direction Y, a ratio of a length L3 of the protruded portions P1 to a length L4 of the third doped region 106 (length L3/length L4) may be ranged from 0.1 to 0.45 as well. The recesses R1 may be the same as, or different from the recesses R2. In other words, the D1 may be the same as, or different from D2; and the W1 may be the same as, or different from W2. In some embodiments of the present invention, two of the 4 recess portions R may be disposed to be corresponded with the other two of the 4 recess portions R, such that the second doped region 104 forms a symmetrical structure.

In another aspect, from a top-view, a circumference of a boundary of the third doped region 106 that is adjacent to a second stack 108b (or adjacent to the second doped region 104) is referred as an inner circumference S1; a circumference of a boundary of the third doped region 106 that is adjacent to a first stack 108a (or adjacent to the first doped region 102) is referred as an outer circumference S2. Because the third doped region 106 has the protruded portions P, a total length of the inner circumference S1 of the third doped region 106 is increased. Thereby, a difference between the total length of the inner circumference S1 and a total length of the outer circumference S2 is reduced. In other words, the total length of the inner circumference S1 may be less than, equal to, or longer than the total length of the outer circumference S2. In some embodiments, a ratio of the inner circumference S1 to the outer circumference S2 (inner circumference S1/outer circumference S2) is, for instance, ranged from 1 to 1.5. In other embodiments, the ratio of inner circumference S1 to the outer circumference S2 is, for instance, ranged from 1 to 2.

As a result of disposing the protruded portions P and the recess portions R, a surface area of a side of the third doped region 106 that is facing the second doped region 104 may be increased. Accordingly, more carriers can pass to the second doped region 104 from the third doped region 106, or pass to the third doped region 106 from the second doped region 104. When the semiconductor device 10 is served as a BJT, a common emitter current gain of the BJT can be accordingly increased.

In the present embodiment, the top-view pattern of the second doped region 104 may have 4 recess portions R; the third doped region 106 may have 4 protruded portions P. However, persons having ordinary skill in the art may alter amounts, shapes and a relative position relationship of the recess portions R and the corresponding protruded portions P according to design requirements, the present invention is not limited thereto.

In the present embodiment, the semiconductor device 10 may further include a first stack 108a and a second stack 108b. The first stack 108a and the second stack 108b are located on the substrate 100. The first stack 108a is located between the first doped region 102 and the third doped region 106. The second stack 108b is located between the second doped region 104 and the third doped region 106. The first stack 108a may include a first insulating layer 110a and a first conductive structure 111a sequentially stacked on the substrate 100. In some embodiments, the first conductive structure 111a may be a single layer, such as a first polysilicon layer 112a. In some alternative embodiments, the first conductive structure 111a may be a double layer. For instance, the double layer includes the first polysilicon layer 112a and a first metal silicide layer 114a sequentially stacked on the first insulating layer 110a.

Similarly, the second stack 108b may include a second insulating layer 110b and a second conductive structure 111b sequentially stacked on the substrate 100. In some embodiments, the second conductive structure 111b may be a single layer, such as a second polysilicon layer 112b. In some alternative embodiments, the second conductive structure 111*b* may be a double layer. For instance, the double layer includes the second polysilicon layer 112*b* and a second metal silicide layer 114*b* sequentially stacked on the second insulating layer 110*b*. Materials of the first metal silicide layer 114*a* and the second metal silicide layer 114*b* may include tungsten silicide, titanium silicide, cobalt silicide, nickel silicide or a combination thereof. Additionally, in some embodiments, a ratio of a width W3 of the first stack 108*a* to a width W4 of the second stack 108*b* (width W3/width W4) is ranged from 0.5 to 2. In alternative embodiments, the ratio of the width W3 of the first stack 108*a* to the width W4 of the second stack 108*b* (width W3/width W4) may also be 0.5 to 1.5.

Furthermore, the semiconductor device 10 may further include a first spacer 116*a* and a second spacer 116*b*. The first spacer 116*a* is located at sidewalls of the first stack 108*a*. The second spacer 116*b* is located at sidewalls of the second stack 108*b*. For simplicity, the first spacer 116*a* and the second spacer 116*b* are omitted from the illustration of FIG. 1A. Materials of the first spacer 116*a* and the second spacer 116*b* may include silicon oxide, silicon oxynitride or a combination thereof.

In some embodiments, a width of a space charge region in the first doped region 102 and a width of a space charge region in the third doped region 106 can be altered by applying voltage to the first stack 108*a*. Thereby, an electric field between the first doped region 102 and the third doped region 106 can be adjusted. Similarly, an electric field between the second doped region 104 and the third doped region 106 can be adjusted by applying voltage to the second stack 108*b*. Therefore, a breakdown voltage between the first doped region 102 and the second doped region 104 can be raised by applying voltage to the first stack 108*a* and the second stack 108*b*. In some embodiments, the second conductive structure 111*b* may be electrically connected with the second doped region 104, and the first conductive structure 111*a* may be electrically connected with the third doped region 106. Thus, when the semiconductor device 10 is served as a BJT, more carriers can be passed through an interface between the second doped region 104 and the third doped region 106. Thereby, a common emitter current gain of the BJT can be raised. In other embodiments, the first conductive structure 111*a* may be electrically connected with the first doped region 102, and the second conductive structure 111*b* may be electrically connected with the third doped region 106. As a result, when the semiconductor device 10 is served as a BJT, a common emitter current gain of the BJT can also be raised.

Referring to FIG. 1B, in some embodiments, the semiconductor 10 may further include a well region 118 of the second conductive type. The well region 118 is located in the substrate 100. From a top-view, the well-region 118 is located at an inner side of the first doped region 102, and the second doped region 104 and the third doped region 106 are located within the well region 118. Moreover, the semiconductor device 10 may further include a field region 120 of the second conductive type. The field region 120 may be located in the well region 118. In addition, the second doped region 104 and the third doped region 106 may be located in the field region 120. In some embodiments, a doping concentration of the well region 118 and a doping concentration of the field region 120 may be respectively ranged from $10^{11}/cm^3$ to $10^{14}/cm^3$. Furthermore, the semiconductor device 10 may further include an isolation structure 121. The isolation structure 121 is located surrounding the first doped region 102, and covering a surface of the substrate 100 and the deep well region 101. The isolation structure 121 may be a local oxidation of silicon (LOCOS) structure or a shallow trench isolation (STI) structure.

Figure 3:
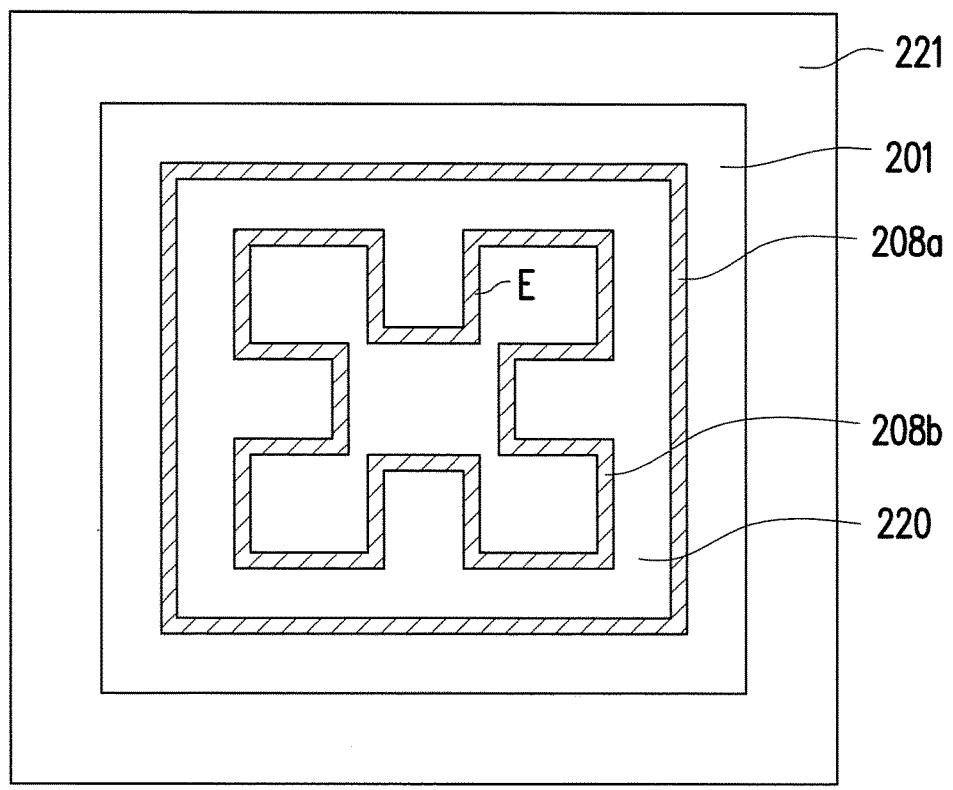
FIG. 3 is a schematic top view of FIG. 2D.
Figure 4:
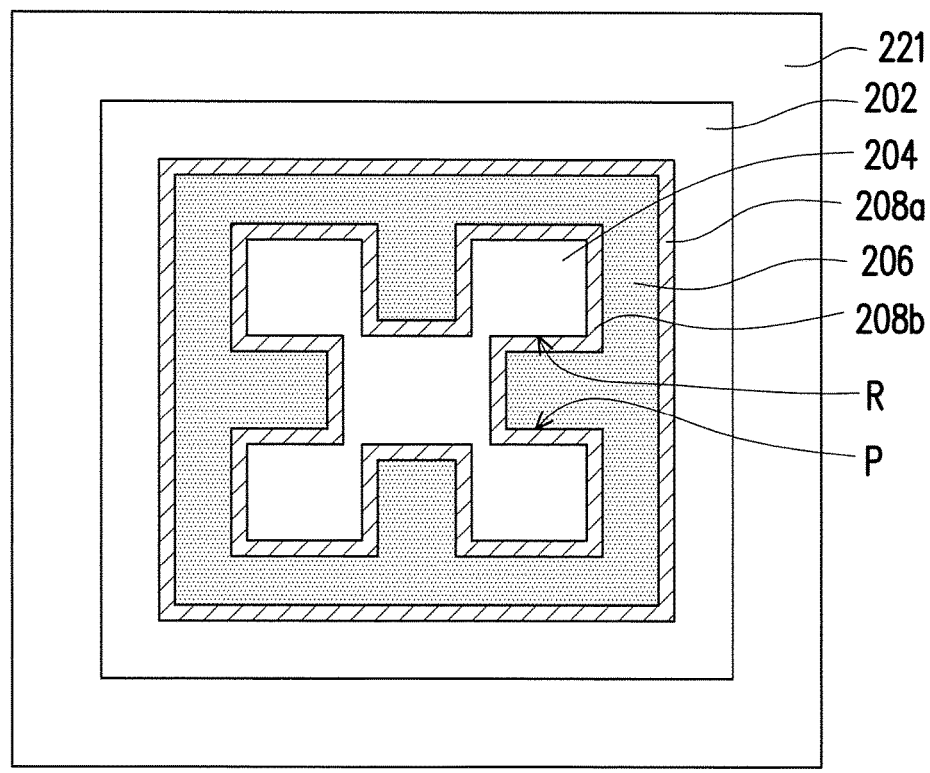
FIG. 4 is a schematic top view of FIG. 2E.

FIG. 2A through FIG. 2G are schematic cross-sectional views of a manufacturing process of a semiconductor device according to an embodiment of the present invention. FIG. 3 is a schematic top view of FIG. 2D. FIG. 4 is a schematic top view of FIG. 2E.

A manufacturing process of a semiconductor device of the present embodiment includes the following steps. It should be noted that, numerals in the following description and the similar ones in FIG. 1A and FIG. 1B are referred to the same element or similar elements (e.g. substrate 100 and substrate 200).

Figure 2A:
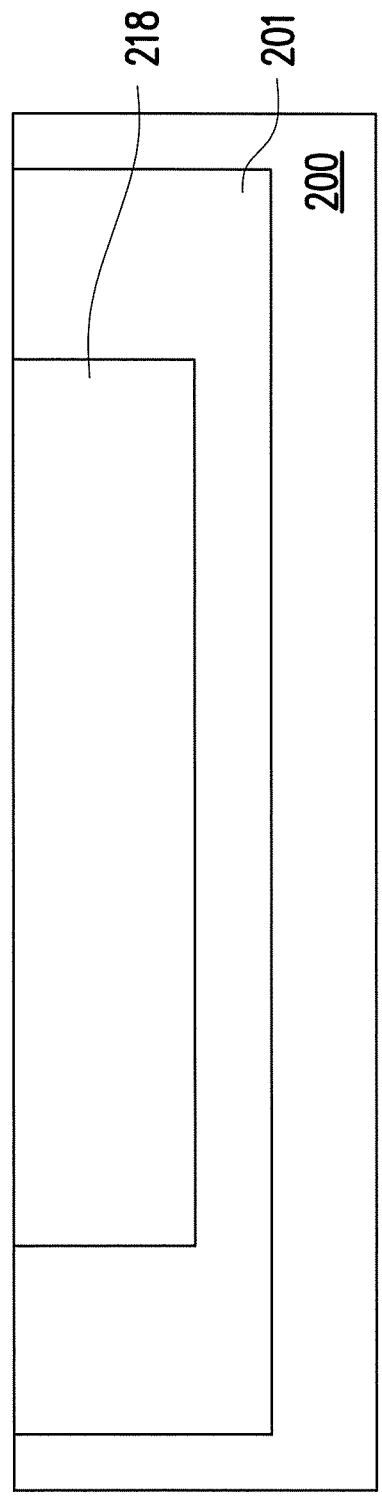
FIG. 2A through FIG. 2H are schematic cross-sectional views of a manufacturing process of a semiconductor device according to an embodiment of the present invention.

Referring to FIG. 2A, a deep well region 201 is formed in the substrate 200. The substrate 200 may be doped with dopants of the second conductive type, while the deep well region 201 may be doped with dopants of the first conductive type. Afterward, a well region 218 may be formed in the deep well region 201. The well region 218 may be doped with dopants of the second conductive type. A method for forming the deep well region 201 and the well region 218 may include ion implantation. In some embodiments, a dosage of the ion implantation applied for forming the deep well region 201 may be ranged from $10^{11}/cm^3$ to $10^{14}/cm^3$, and energy of the ion implantation may be ranged from 2 KeV to 200 KeV. Similarly, a dosage of the ion implantation applied for forming the well region 218 may also be ranged from $10^{11}/cm^3$ to $10^{14}/cm^3$, and energy of the ion implantation may be ranged from 2 KeV to 200 KeV as well.

Figure 2B:
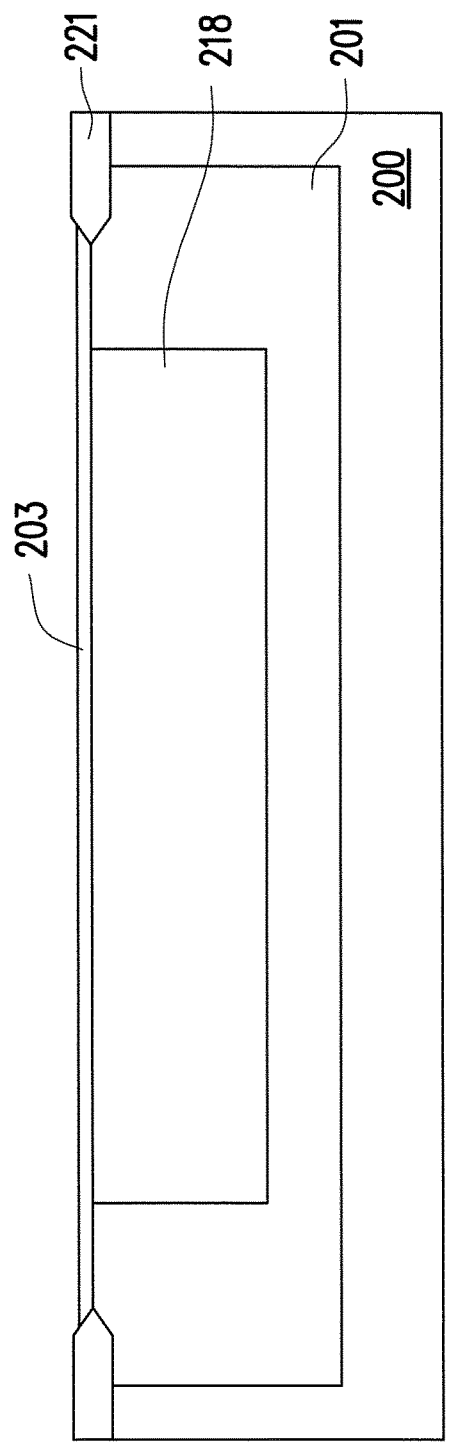

Referring to FIG. 2B, an isolation structure 221 is formed on the substrate 200. The isolation structure 221 covers a portion of a surface of the deep well region 201 and the substrate 200. A method for forming the isolation structure 221 may include forming a hard mask layer 203 partly covering the deep well region 201. Subsequently, performing a process of local oxidation, to form the isolation structure 221 on the substrate 200 exposed by the hard mask layer 203. However, the present invention is not limited to the formation method and the structure of the isolation structure.

Figure 2C:
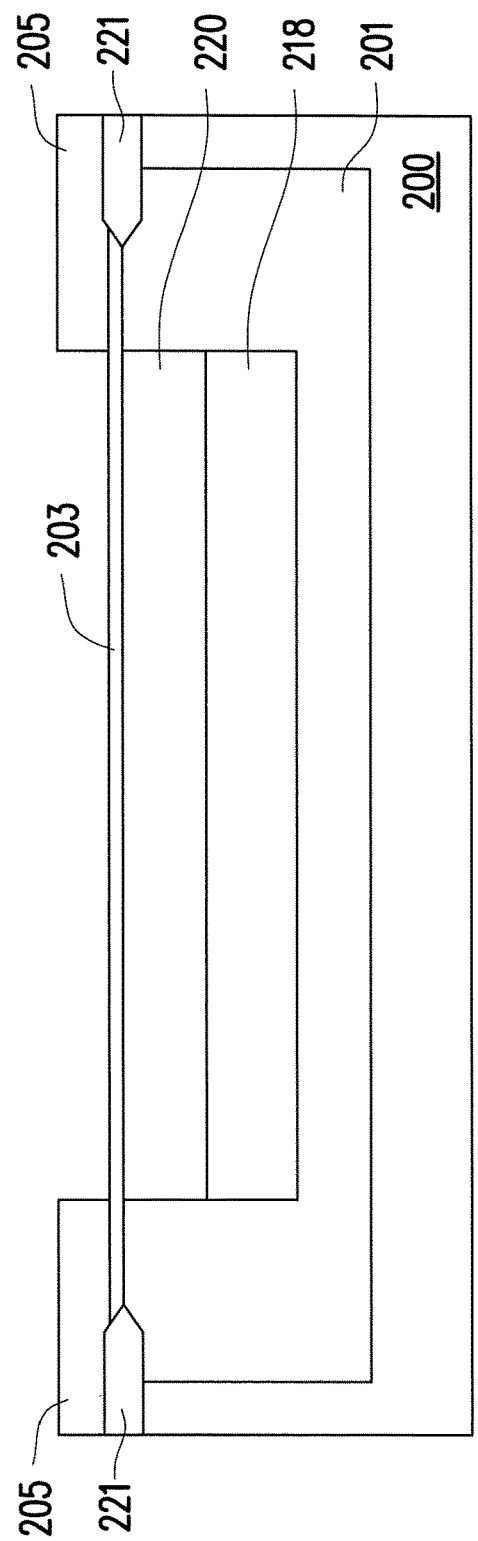

Referring to FIG. 2C, a photoresist layer 205 may be formed on the hard mask layer 203, to cover the substrate 200 surrounding the well region 218. Thereafter, an ion implantation may be performed by using the photoresist 205 as a mask, to form a field region 220 in the well region 218. In some embodiments, a dosage of the ion implantation applied for forming the field region 220 may be ranged from $10^{11}/cm^3$ to $10^{14}/cm^3$, and energy of the ion implantation may be ranged from 2 KeV to 200 KeV. Subsequently, the photoresist layer 205 and the hard mask layer 203 may be removed.

Figure 2D:
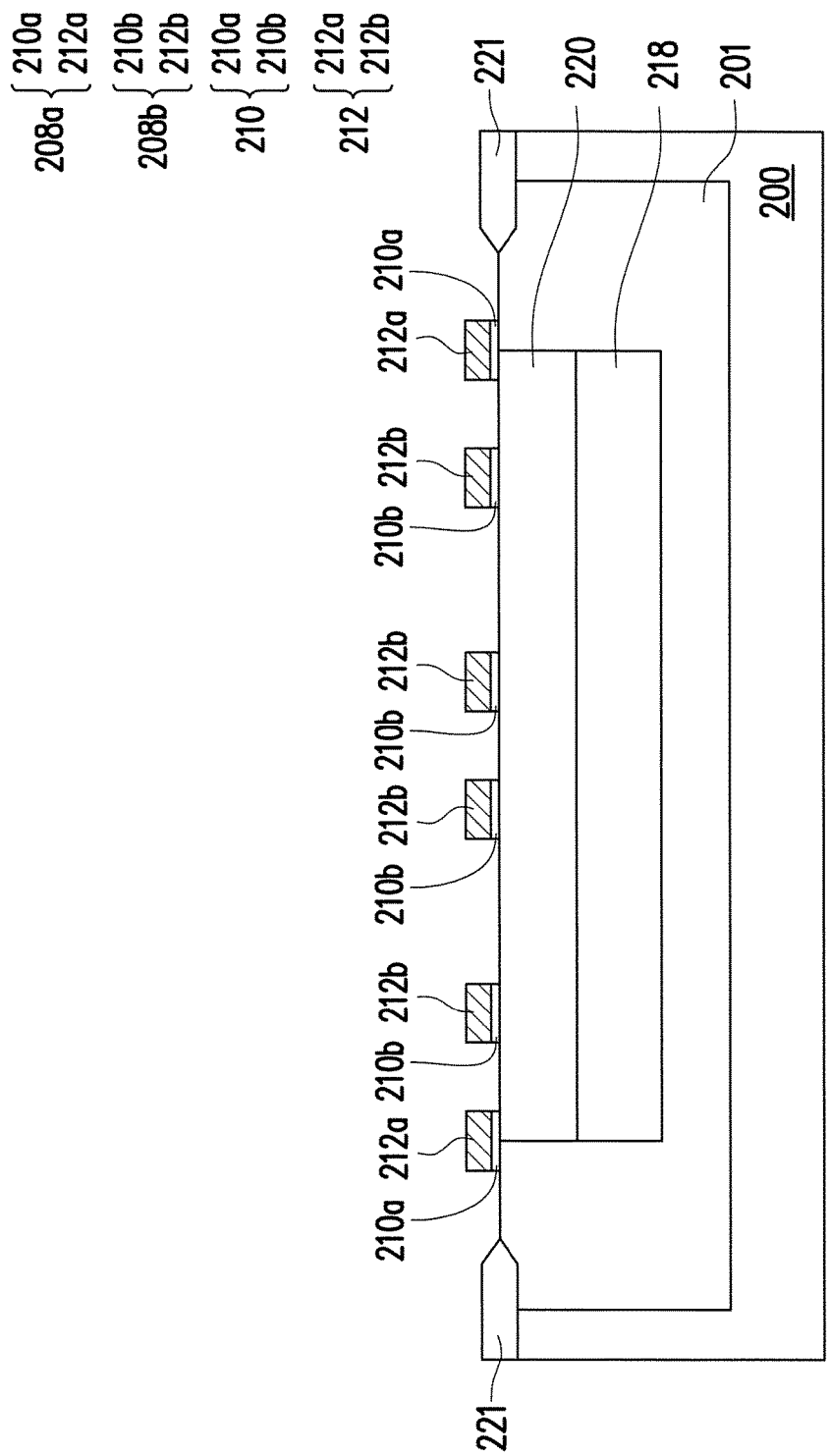

Referring to FIG. 2D and FIG. 3, an insulating material layer and a polysilicon material layer may be sequentially formed on the substrate 200. Then, the insulating material layer and the polysilicon material layer may be patterned to form an insulating layer 210 and a polysilicon layer 212. The insulating layer 210 may include a first insulating layer 210*a* and a second insulating layer 210*b*, and the polysilicon layer 212 may include a first polysilicon layer 212*a* and a second polysilicon layer 212*b*. In some embodiments, the first insulating layer 210*a* and the first polysilicon layer 212*a* compose a first stack 208*a*. The second insulating layer 210*b* and the second polysilicon layer 212*b* compose a second stack 208*b*.

From a top-view, the first stack 208*a* may cover a part of the deep well region 201 and a part of the field region 220.

The second stack 208b is located at an inner side of the first stack 208a (as shown in FIG. 3). Additionally, a top-view pattern of the second stack 208b may have recess portions E (shown as FIG. 3), and the recess portions E have openings toward the first stack 208a. In the present embodiment, the top-view pattern of the second stack 208b may have 4 recess portions E. In the present embodiment, the top-view pattern of the second stack 208b may have 4 recess portions E. Nevertheless, number, shape and relative position relationship of the recess portions E of the second stack 208b may be altered by persons having ordinary skill in the art according to design requirements, the present invention is not limited thereto.

Figure 2E:
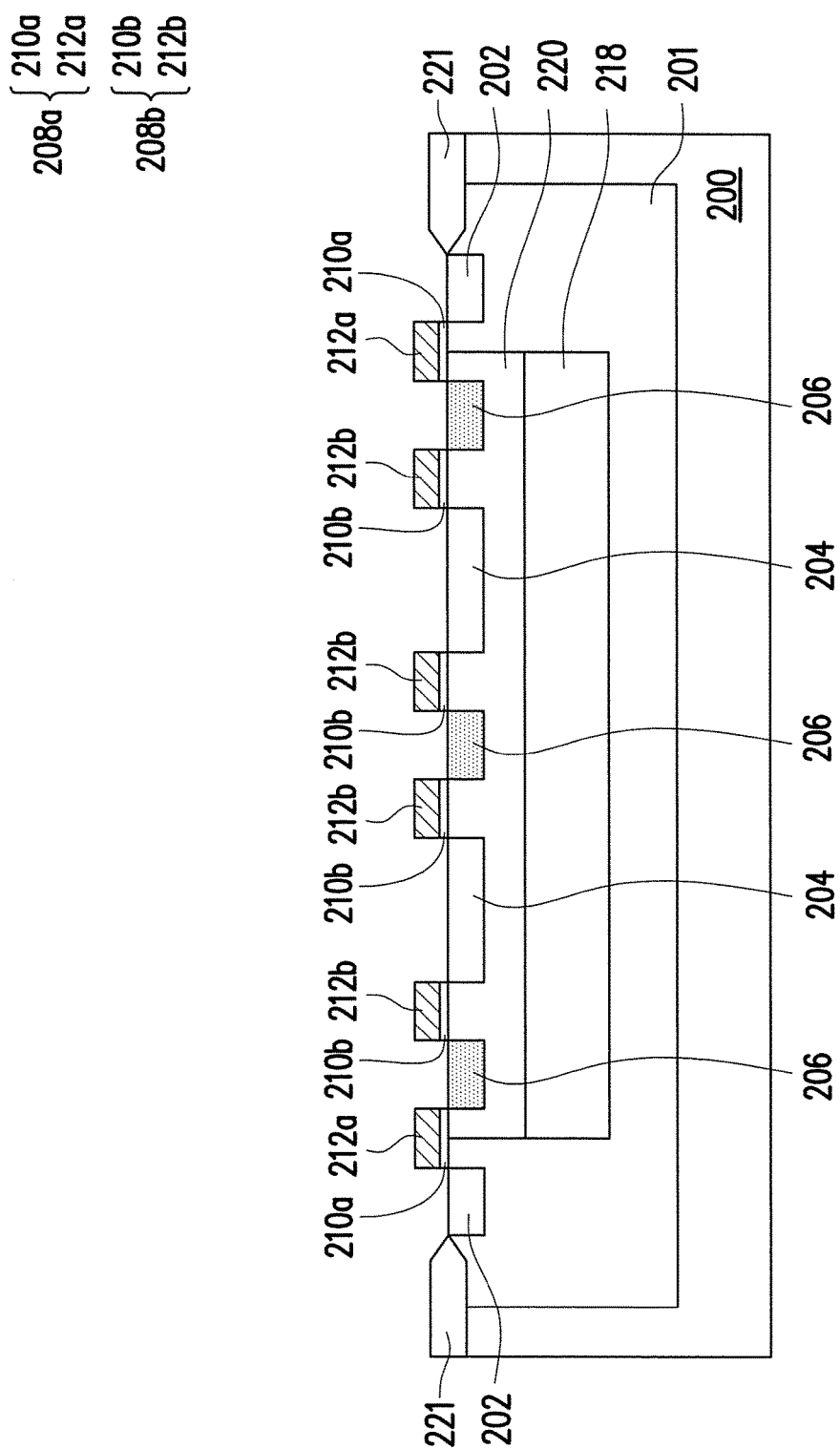

Referring to FIG. 2E, an ion implantation is performed to form a first doped region 202, a second doped region 204 and a third doped region 206. Specifically, the first doped region 202 is of the first conductive type and formed in the field region 220 between the first stack 208a and the isolation structure 221. In some embodiments, a dosage of the ion implantation applied for forming the first doped region 202 may be ranged from $10^{11}/cm^3$ to $10^{16}/cm^3$, and energy of the ion implantation may be ranged from 2 KeV to 200 KeV. The second doped region 204 is of the first conductive type and formed in the field region 220 at an inner side of the second stack 208b. In some embodiments, a dosage of the ion implantation applied for forming the second doped region 204 may be ranged from $10^{11}/cm^3$ to $10^{16}/cm^3$, and energy of the ion implantation may be ranged from 2 KeV to 200 KeV. The third doped region 206 is of the second conductive type and formed within the field region 220 between the first stack 208a and the second stack 208b. In some embodiments, a dosage of the ion implantation applied for forming the third doped region 206 may be ranged from $10^{11}/cm^3$ to $10^{16}/cm^3$, and energy of the ion implantation may be ranged from 2 KeV to 200 KeV.

Referring to FIG. 4, the third doped region 206 has protruded portions P. These protruded portions P and the recess portions E of the second stack 208b are in correspondence with each other. Correspondingly, the second doped region 204 is formed to have recess portions R. These recess portions R and the recess portions E of the second stack 208b are in correspondence with each other as well (as shown in FIG. 3). It should be noted that, relationship between dimensions of the protruded portions P and the recess portions R with respect to dimensions of the third doped region 206 and the second doped region 204, respectively, has been delineated in the embodiment as shown in FIG. 1A, it would not be repeated again herein.

Figure 2F:
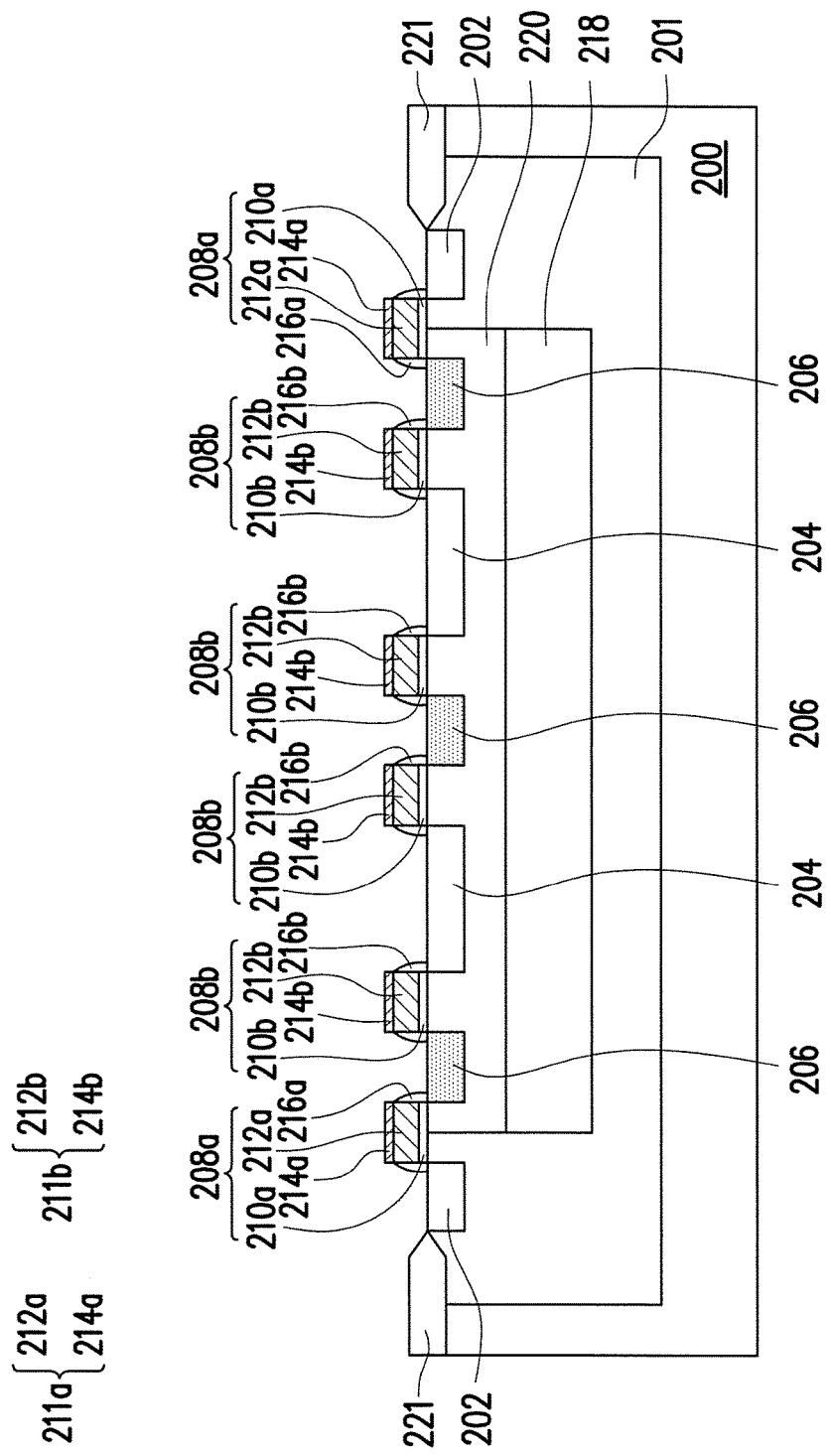

Referring to FIG. 2F, in some embodiments, first spacers 216a may be formed at sidewalls of the first stack 208a, and second spacers 216b may be formed at sidewalls of the second stack 208b. Thereafter, a first metal silicide layer 214a may be formed on the first polysilicon layer 212a, and a second metal silicide layer 214b may be formed on the second polysilicon layer 212b. The first polysilicon layer 212a and the first metal silicide layer 214a on the first insulating layer 210a compose a first conductive structure 211a, and the second polysilicon layer 212b and the second metal silicide layer 214b on the second insulating layer 210b compose a second conductive structure 211b. In other words, in these embodiments, the first conductive structure 211a is a double layer structure, and the second conductive structure 211b is a double layer structure as well. In other embodiments, the first conductive structure 211a may be a single layer structure, such as the first polysilicon layer 212a. Similarly, the second conductive structure 211b may be a single layer structure, such as the second polysilicon layer 212b. A method for forming the first spacer 216a and the second spacer 216b may include conformally forming a material layer on the substrate 200. Subsequently, performing an etch back process on the material layer, to form the first spacer 216a and the second spacer 216b. Moreover, the first metal silicide layer 214a and the second metal silicide layer 214b may be formed by a self-aligned silicide (salicide) process.

Figure 2G:
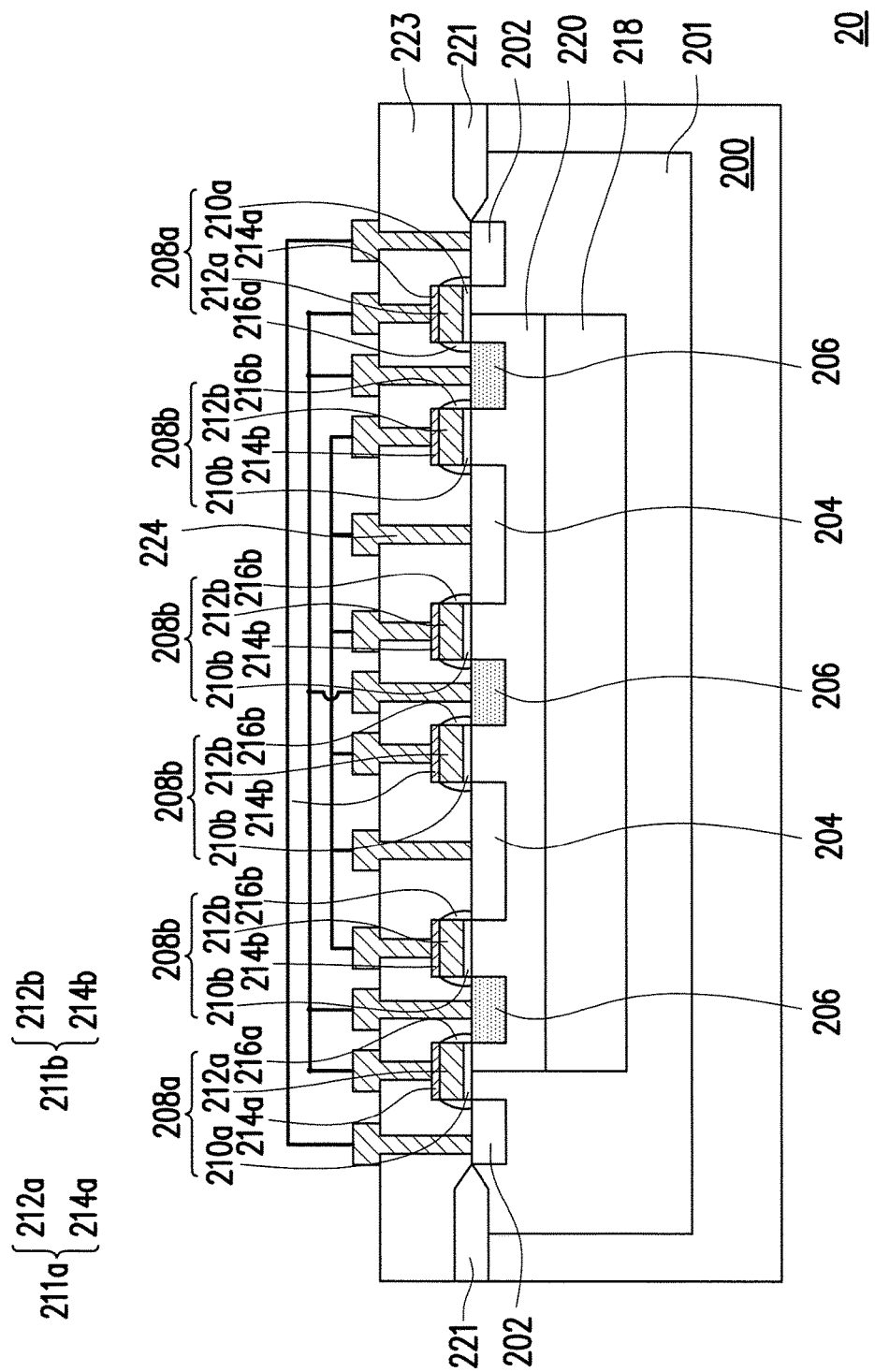

Referring to FIG. 2G, a dielectric layer 223 may be framed on the substrate 200. In some embodiments, a material of the dielectric layer 223 may include silicon oxide, silicon nitride or other dielectric materials having a low dielectric constant (e.g. dielectric constant lower than 4). The dielectric layer 223 may have a plurality of contact holes exposing the first doped region 202, the second doped region 204, the third doped region 206, the first stack 208a and the second stack 208b. Afterward, a plurality of contacts 224 may be formed in the contact holes, respectively. A material of the contacts 224 may be a conductive material, such as metal or metal compound. Thereafter, metal interconnections are formed.

Figure 2H:
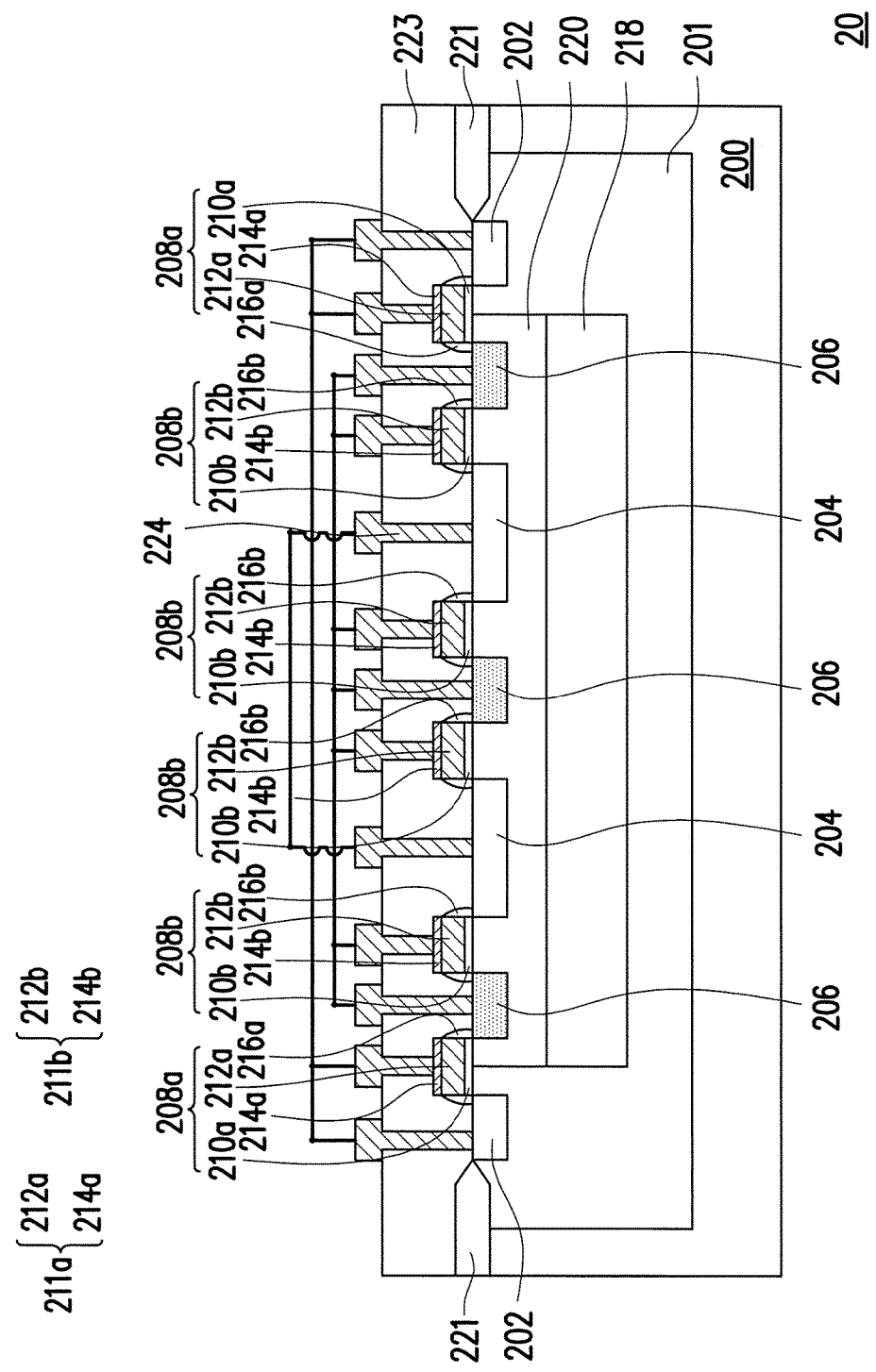

In the present embodiments, referring to FIG. 2G, the metal interconnections may be formed to electrically connect the second conductive structure 211b of the second stack 208b with the second doped region 204, and electrically connect the first conductive structure 211a of the first stack 208a with the third doped region 206. In alternative embodiments, referring to FIG. 2H, the metal interconnections may be formed to electrically connect the first conductive structure 211a of the first stack 208a with the first doped region 202, and/or electrically connect the second conductive structure 211b of the second stack 208b with the third doped region 206.

Now the semiconductor device 20 has been formed. In some embodiments, the semiconductor device 20 may be served as a BJT. In particular, the first doped region 202 may be served as a collector of the BJT, the second doped region 204 may be served as an emitter of the BJT, and the third doped region 206 may be served as a base of the BJT.

Figure 5:
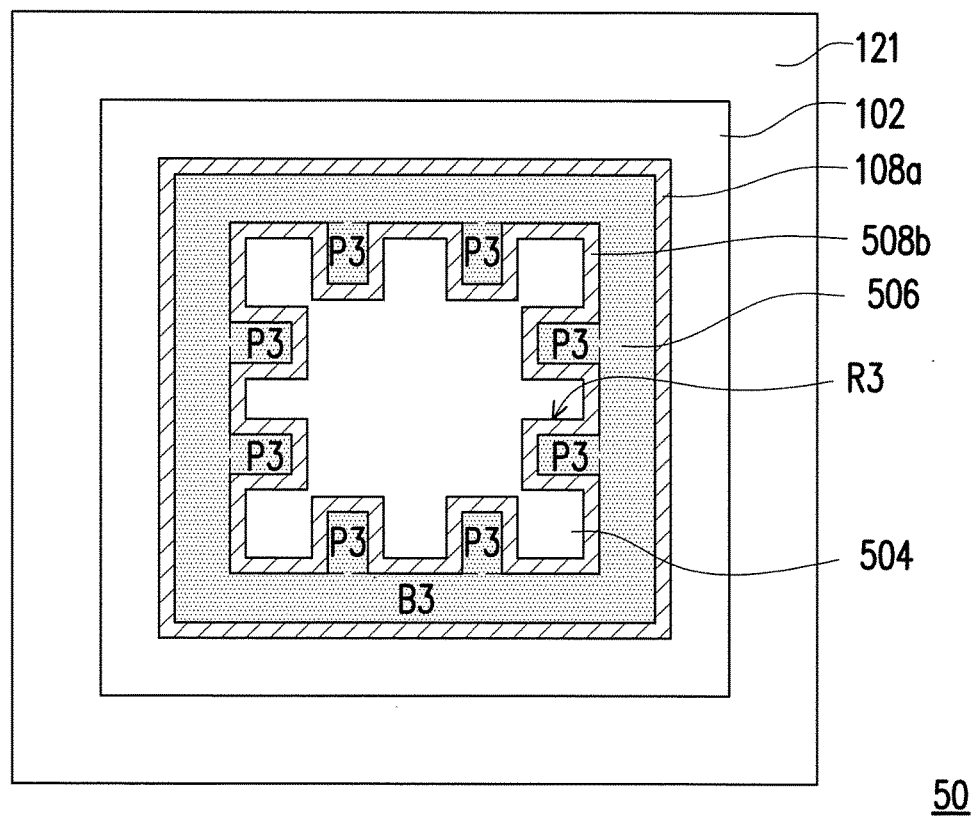
FIG. 5 is a schematic top view of a semiconductor device according to another embodiment of the present invention.

FIG. 5 is a schematic top view of a semiconductor device according to another embodiment of the present invention.

Referring to FIG. 5, the semiconductor device 50 of the present embodiment is similar to the semiconductor device 10 shown in FIG. 1A and FIG. 1B. Difference between the semiconductor device 50 and the semiconductor device 10 would be described in the following description, while similar parts and the same parts thereof would not be repeated again. A third doped region 506 of the semiconductor device 50 includes a body portion B3 and protruded portions P3. In the present embodiment, the third doped region 506 may have 8 protruded portions P3. Specifically, 2 protruded portions P3 are disposed at each side of the third doped region 506. In addition, the 4 protruded portions, of which 2 protruded portions are facing the other 2 protruded portions, are disposed correspondingly, such that the third doped region 506 forms a symmetrical structure. At each side of the third doped region 506, a ratio of a sum of width of the 2 protruded portions P3 to a length of the third doped region 506 may be greater than 0 and less than or equal to 2. Correspondingly, a top-view pattern of the second doped region 504 has 8 recess portions R3 in correspondence with the protruded portions P3. Furthermore, a second stack 508b between the second doped region 504 and the third doped region 506 has 8 recess portions corresponded with the protruded portions P3 as well.

As above, the top-view pattern of the second doped region has at least one recess portion, so that a side of the second doped region that is facing the third doped region can have a larger surface area. Accordingly, more carriers can pass to the second doped region from the third doped region, or pass to the third doped region from the second doped region when the semiconductor is under operation. When the semiconductor device is served as a BJT, a common emitter current gain of the BJT can be accordingly increased.

Moreover, in some embodiments, the first stack may be disposed on the substrate between the first doped region and the third doped region, and the second stack may be disposed on the substrate between the second doped region and the third doped region. By applying voltage to the first stack, a width of a space charge region in the first doped region and the third doped region can be altered. Therefore, an electric field between the second doped region and the third doped region can be adjusted. Similarly, an electric field between the second doped region and the third doped region can be adjusted by applying voltage to the second stack. Therefore, a breakdown voltage between the first doped region and the second doped region can be increased by altering width of the space charge region in the first doped region, the second doped region and the third doped region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a first doped region of a first conductive type, located in a substrate;
   a second doped region of the first conductive type, located in the substrate and located at a side of the first doped region, and a top-view pattern of the second doped region has at least one recess portion; and
   a third doped region of a second conductive type, located in the substrate and located between the first doped region and the second doped region, and a top-view pattern of the third doped region has at least one protruded portion in correspondence with the at least one recess portion,
   wherein the third doped region has a body portion, the at least one protruded portion connected with the body portion, and the at least one protruded portion extends toward a center of the semiconductor device.

2. The semiconductor device according to claim 1, further comprising a well region of the second conductive type, located in the substrate, wherein a top-view pattern of the well region is located at an inner side of a top-view pattern of the first doped region, and the second doped region and the third doped region are located in the well region.

3. The semiconductor device according to claim 1, further comprising a field region, located in the substrate, wherein the second doped region and the third doped region are located in the field region.

4. The semiconductor device according to claim 1, wherein a top-view pattern of the first doped region and the top-view pattern of the third doped region are closed ring patterns.

5. The semiconductor device according to claim 1, wherein both of the top-view pattern of the second doped region and the top-view pattern of the third doped region are in symmetrical shapes.

6. The semiconductor device according to claim 1, wherein the at least one recess portion comprises a plurality of recess portions, and the at least one protruded portion comprises a plurality of protruded portions, the plurality of recess portions and the plurality of protruded portions are disposed in correspondence with each other.

7. The semiconductor device according to claim 1, wherein a ratio of a depth of the at least one recess portion to a length of the top-view pattern of the second doped region along a first direction or a second direction is ranged from 0.1 to 0.45, the first direction is intersected with the second direction.

8. The semiconductor device according to claim 1, wherein a ratio of an inner circumference of the top-view pattern of the third doped region to an outer circumference of the top-view pattern of the third doped region is ranged from 1 to 2, wherein the inner circumference is a circumference of a boundary of the third doped region adjacent to the second doped region, the outer circumference is a circumference of a boundary of the third doped region adjacent to the first doped region.

9. The semiconductor device according to claim 1, further comprising:
   a first stack, located on the substrate between the first doped region and the third doped region, the first stack comprises a first insulating layer and a first conductive structure sequentially stacked on the substrate; and
   a second stack, located on the substrate between the second doped region and the third doped region, the second stack comprises a second insulating layer and a second conductive structure sequentially stacked on the substrate.

10. The semiconductor device according to claim 9, wherein the first conductive structure comprises a first polysilicon layer and a first metal silicide layer sequentially stacked on the first insulating layer, the second conductive structure comprises a second polysilicon layer and a second metal silicide layer sequentially stacked on the second insulating layer, the semiconductor device further comprises a first spacer and a second spacer, the first spacer is located at sidewalls of the first stack, and the second spacer is located at sidewalls of the second stack.

11. The semiconductor device according to claim 9, wherein a ratio of a width of the first stack to a width of the second stack is ranged from 0.5 to 1.5.

12. The semiconductor device according to claim 9, wherein the second conductive structure is electrically connected with the second doped region, and the first conductive structure is electrically connected with the third doped region.

13. The semiconductor device according to claim 9, wherein the first conductive structure is electrically connected with the first doped region, and the second conductive structure is electrically connected with the third doped region.

14. A semiconductor device, comprising:
   a first doped region of a first conductive type, located in a substrate;
   a second doped region of the first conductive type, located in the substrate and located at a side of the first doped region;
   a third doped region of a second conductive type, located in the substrate and located between the first doped region and the second doped region, wherein the third doped region surrounds an area of the second doped region from outside of the second doped region;
   a first stack, located on the substrate between the first doped region and the third doped region, the first stack comprises a first insulating layer and a first conductive structure sequentially stacked on the substrate; and a second stack, located on the substrate, and located between the second doped region and the third doped region, the second stack comprises a second insulating layer and a second conductive structure sequentially stacked on the substrate.

15. The semiconductor device according to claim 14, wherein the second conductive structure is electrically connected with the second doped region, and the first conductive structure is electrically connected with the third doped region.

16. The semiconductor device according to claim 14, wherein the first conductive structure is electrically connected with the first doped region, and the second conductive structure is electrically connected with the third doped region.

* * * * *